(12) United States Patent
Ewer

(10) Patent No.: US 6,512,304 B2
(45) Date of Patent: Jan. 28, 2003

(54) NICKEL-IRON EXPANSION CONTACT FOR SEMICONDUCTOR DIE

(75) Inventor: Peter R. Ewer, Oxted (GB)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/782,245

(22) Filed: Feb. 13, 2001

(65) Prior Publication Data

US 2001/0033022 A1 Oct. 25, 2001

Related U.S. Application Data

(60) Provisional application No. 60/199,694, filed on Apr. 26, 2000.

(51) Int. Cl.[7] ............................................... H01L 23/48
(52) U.S. Cl. ..................... 257/779; 257/747; 257/735; 257/734; 257/772; 257/666; 257/781; 257/783; 257/784; 257/785
(58) Field of Search ................................. 257/666, 735, 257/734, 772, 779, 747, 781, 783, 784, 785

(56) References Cited

U.S. PATENT DOCUMENTS

| | | | | |
|---|---|---|---|---|
| 4,210,926 A | * | 7/1980 | Hacke | ........................ 357/70 |
| 5,576,246 A | | 11/1996 | Conru et al. | |
| 5,885,892 A | | 3/1999 | Kondo | |
| 6,002,165 A | * | 12/1999 | Kinsman | .................... 257/666 |
| 6,269,011 B1 | * | 7/2001 | Ohshima | .................... 323/908 |
| 6,307,755 B1 | * | 10/2001 | Williams et al. | ............ 174/260 |

* cited by examiner

Primary Examiner—Albert W. Paladini
Assistant Examiner—Luan Thai
(74) Attorney, Agent, or Firm—Ostrolenk, Faber, Gerb & Soffen, LLP

(57) ABSTRACT

A contact clip for the aluminum contact of a semiconductor device has a central nickel-iron body, preferably Nilo alloy 42, which is coated on top and bottom by a soft, but high conductivity metal such as gold, silver or copper. The nickel-iron body has a thickness of about 15 mils, and is about the thickness of the silicon die. The conductive layers have a thickness of about 5% to 20% of that of the nickel-iron core.

24 Claims, 1 Drawing Sheet

NICKEL-IRON EXPANSION CONTACT FOR SEMICONDUCTOR DIE

RELATED APPLICATIONS

This application is related to and claims priority to Provisional Application Serial No. 60/199,694 filed Apr. 26, 2000.

BACKGROUND OF THE INVENTION

This invention relates to semiconductor device contacts and more specifically relates to a novel expansion contact for a high power semiconductor device die.

BRIEF SUMMARY OF THE INVENTION

High power silicon die such as diode die, power MOSFET die, IGBT die and thyristor die are operated at relatively high temperatures and experience considerable thermal expansion and contraction. Electrical contacts to the die surfaces must provide a low ohmic resistance contact and should not exert high differential expansion and contraction stress on the die since such stress can damage or crack the fragile die.

Power MOSFETs and IGBTs are often provided with ultrasonically formed aluminum wire bonds to their aluminized source or emitter surfaces. This is a relatively small area bond which will not overly stress the underlying silicon. However, when lower contact resistance is needed, large area copper electrodes, for example, are soldered, or connected to the die top electrode surface by a conductive epoxy. The solders used are "soft" solders so that the solder, like the epoxy, will absorb a certain amount of the differential stress caused by the differential expansion of the copper and of the silicon die.

It is known to use materials having thermal expansion characteristics like that of silicon, such as molybdenum, tungsten or nickel-iron alloys as an intermediary between a silicon die contact surface and a larger contact body. These arrangements are principally used in the thyristor art and are very expensive.

It would be very desirable to provide a contact structure for connection to selected areas of a semiconductor die which will not cause differential thermal expansion and contraction stress and which is inexpensive and is adaptable to mass production techniques.

BRIEF DESCRIPTION OF THE INVENTION

A novel contact (sometimes termed a "clip") is provided for the active surface area of a silicon die such as a power MOSFET which consists of a "sandwich" of a low expansion material, particularly a nickel-iron alloy, which is coated on its opposite surfaces by a highly electrically conductive layer of metal. In the preferred embodiment of the invention a nickel-iron alloy known by the trade name "NiLo alloy 42" is coated with a conductive layer of silver, gold or copper. This conductive layer is thin and soft relative to the thickness and hardness respectively of the nickel-iron body. Thus, the thermal expansion properties of the clip will be nearer to those of the nickel-iron alloy while its electrically conductive properties will be closer to those of the coating. By way of example, the nickel-iron alloy thickness may be close to that of the die, and may be about 15 mils. The coating thickness, however, can be about 2 mils or less. The clip can be bent to cover only the desired active area of the die to which it is connected.

DETAILED DESCRIPTION OF THE DRAWINGS

Figure 1:
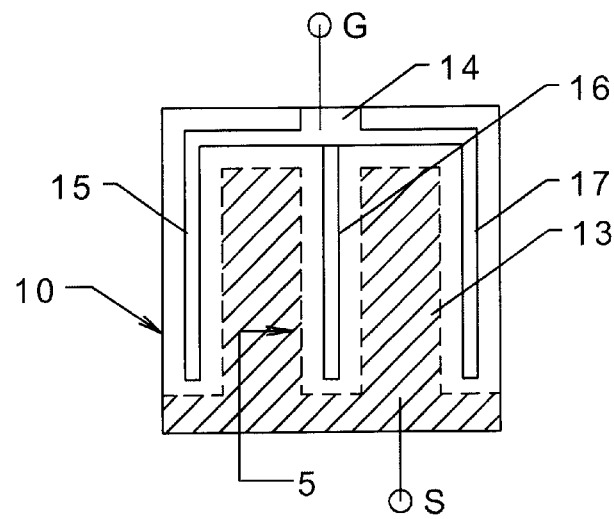
FIG. 1 is a top view of the typical power MOSFET die.
Figure 2:
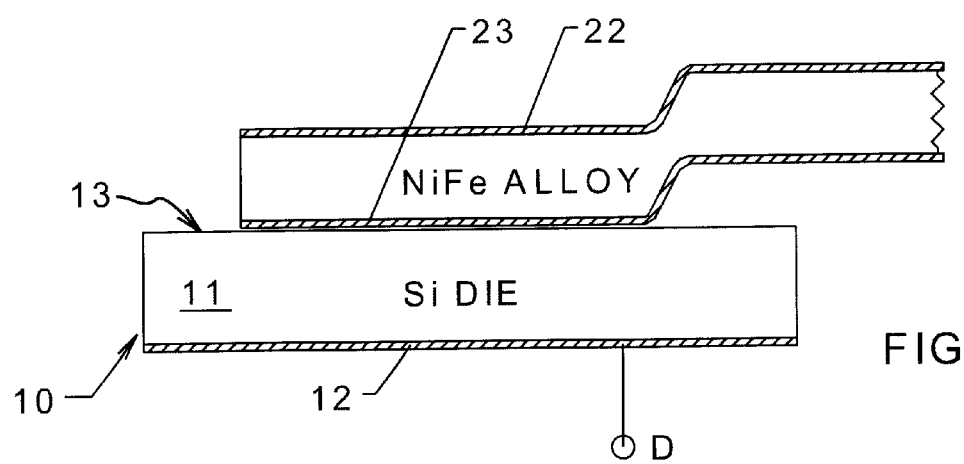
FIG. 2 shows the novel clip of the invention, connected to the die of FIG. 1.

FIGS. 1 and 2 show the invention as applied to a power MOSFET die 10 which consists of a monocrystaline silicon body 11 having a bottom tri-metal drain contact 12 and an upper active source surface, schematically shown in shaded line outline 13 in FIG. 1. Active area 13 contains power MOSFET junctions, such as spaced planar cells, or stripes, or a trench topology, all covered by a source (or emitter) contact which may be of aluminum or other conductive metal. The die will also have a gate contact 14, which may have runners 15, 16 and 17 extending therefrom.

The novel clip connector 20 of the invention may be shaped to connect to the aluminum source contact 13 (the shaded area 13 in FIG. 1) and has a body 21 of a suitable expansion contact metal which is coated on at least its top and bottom by coatings 22 and 23 respectively which may be aluminum or some other relatively thin but highly conductive material as compared to the thickness and conductivity respectively of body 21. Note that body 21 may be reentrantly bent to prevent its contact to gate 14 or runners 15, 16 and 17. Alternatively, the body 21 can be stamped to conform to all or part or to selected parts of the source electrode pattern.

Body 21 is chosen from materials having a temperature coefficient of expansion close to or matched to that of the silicon. Thus, the expansion and contraction of die 11 and body 21 will be closely matched so as to relieve stress on the die due to temperature cycling. The body 21, however, does not have good electrical conductivity. Therefore, it is coated with layers 22 and 23 of very high conductivity materials. By properly balancing the thicknesses of body 21 and layers 22 and 23, one can obtain a contact clip having thermal expansion characteristics very close to those of the body 21, and electrical conduction characteristics very close to those of conductive layers 22 and 23.

In a preferred embodiment, body 21 is a nickel-alloy known as "Nilo alloy 42", coated with a highly conductive layer of gold, silver or copper. The conductive layers 22, 23 may be from about 5% to 20% of the thickness of body 21.

The conductive layer 23 can be secured to the aluminum source contact by soldering, or by a silver loaded, conductive epoxy or by any other metallurgical bonding technique. The clip connector 20 may then be connected to any desired lead frame pin or the like of the package containing the die 11.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A conductive contact clip for contacting the surface of a silicon die; said contact clip comprising a generally flat elongated body having a planar contact area; said elongated body having top and bottom surfaces and a central major thickness section of a first material having a thermal expansion coefficient which is approximately that of silicon and having top and bottom conductive layers at said top and bottom surfaces of a second material having an electrical conductivity substantially greater than that of said first material, said top and bottom conductive layers each being from about 5% to about 20% of the thickness of said first material, and wherein said central major thickness section is approximately equal in thickness to that of said silicon die.

2. The device of claim 1 wherein said second material has a thermal coefficient expansion which is substantially greater than that of said first material.

3. The device of claim 1 wherein said first material is adapted to be solderable to a connector terminal and said second material is adapted to be solderable to an aluminum surface.

4. The device of claim 3 wherein said top and bottom conductive layers are each selected from the group consisting of gold, silver and copper.

5. The device of claim 4 wherein said second material has a thermal coefficient expansion which is substantially greater than that of said first material.

6. The device of claim 1 wherein said top and bottom conductive layers are each selected from the group consisting of gold, silver and copper.

7. The device of claim 1 wherein said first material is a nickel-iron alloy.

8. The device of claim 7 wherein said top and bottom conductive layers are each selected from the group consisting of gold, silver and copper.

9. The device of claim 8 wherein said second material has a thermal coefficient expansion which is substantially greater than that of said first material.

10. The device of claim 1 wherein said first material has a thickness of about 15 mils.

11. The device of claim 10 wherein said top and bottom conductive layers are each selected from the group consisting of gold, silver and copper.

12. The device of claim 10 wherein said first material is a nickel-iron alloy.

13. In a power semiconductor device comprising a silicon die having at least one extended area aluminum contact on its surface to which contact can be made by wire bonding; a contact clip which is rigidly connected to said die and which makes low resistance contact to said aluminum contact; said contact clip comprising an elongated body having a planar contact area; said elongated body having top and bottom surfaces and a central major thickness section of a first material having a thermal expansion coefficient which is approximately that of silicon and having top and bottom conductive layers at said top and bottom surfaces which each are of materials which have an electrical conductivity substantially greater than that of said first material and are each from about 5% to about 20% of the thickness of said first material; said bottom contact layer being permanently and rigidly connected to at least a portion of said extended area aluminum contact, wherein said first material has a thickness approximately equal to that of said silicon die.

14. The device of claim 13 wherein said bottom conductive layer is connected to said aluminum contact by solder.

15. The device of claim 13 wherein said bottom conductive layer is connected to said aluminum by a conductive epoxy.

16. The device of claim 13 wherein said top and bottom conductive layers each has a thermal coefficient of expansion which is substantially greater than that of said first material.

17. The device of claim 13 wherein said top and bottom conductive layers are each selected from the group consisting of gold, silver and copper and combinations thereof.

18. The device of claim 17 wherein said first material is a nickel-iron alloy.

19. The device of claim 13 wherein said first material is a nickel-iron alloy.

20. The device of claim 13 wherein said first material has a thickness of about 15 mils.

21. The device of claim 20 wherein said first material is a nickel-iron alloy.

22. The device of claim 21 wherein said top and bottom conductive layers are each selected from the group consisting of gold, silver and copper and combinations thereof.

23. The device of claim 13 wherein said first material is about 15 mils thick.

24. The device of claim 23 wherein said top and bottom conductive layers are each selected from the group consisting of gold, silver and copper.

* * * * *